US012680189B2

(12) United States Patent
Mueller et al.

(10) Patent No.: US 12,680,189 B2
(45) Date of Patent: Jul. 14, 2026

(54) PROCESS FOR MANUFACTURING A MONOCRYSTALLINE SILICON SEMICONDUCTOR WAFER, AND MONOCRYSTALLINE SILICON SEMICONDUCTOR WAFER

(71) Applicant: SILTRONIC AG, Munich (DE)

(72) Inventors: Timo Mueller, Burghausen (DE); Michael Boy, Waging am See (DE); Michael Gehmlich, Weissenborn (DE); Gudrun Kissinger, Frankfurt (DE); Dawid Kot, Slubice (PL)

(73) Assignee: SILTRONIC AG, Munich (DE)

(*) Notice: Subject to any disclaimer, the term of this patent is extended or adjusted under 35 U.S.C. 154(b) by 315 days.

(21) Appl. No.: 18/691,466

(22) PCT Filed: Sep. 5, 2022

(86) PCT No.: PCT/EP2022/074567
§ 371 (c)(1),
(2) Date: Mar. 13, 2024

(87) PCT Pub. No.: WO2023/041359
PCT Pub. Date: Mar. 23, 2023

(65) Prior Publication Data
US 2025/0129506 A1 Apr. 24, 2025

(30) Foreign Application Priority Data

Sep. 16, 2021 (EP) ..................................... 21197148

(51) Int. Cl.
*C30B 33/02* (2006.01)
*C30B 15/20* (2006.01)
(Continued)

(52) U.S. Cl.
CPC ............ *C30B 15/203* (2013.01); *C30B 29/06* (2013.01); *C30B 33/02* (2013.01); *H10P 36/20* (2026.01)

(58) Field of Classification Search
CPC ....... C30B 15/203; C30B 29/06; C30B 33/02; H10P 36/20
See application file for complete search history.

(56) References Cited

U.S. PATENT DOCUMENTS 6,143,071 A * 11/2000 Aihara .................... C30B 29/06
117/1
6,228,164 B1 5/2001 Ammon et al.
(Continued)

FOREIGN PATENT DOCUMENTS

DE 102016225138 A1 6/2018
EP 0962555 A1 12/1999
(Continued)

*Primary Examiner* — Robert M Kunemund
(74) *Attorney, Agent, or Firm* — LEYDIG, VOIT & MAYER, LTD.

(57) ABSTRACT

A semiconductor wafer of monocrystalline silicon is produced, in the following order: growing a single crystal of silicon by the CZ method; dividing off a wafer consisting completely of an N region, in which there are no agglomerates of silicon interstitials or vacancies having a diameter of more than 20 nm, and has an oxygen concentration of not less than $5.3 \times 10^{17}$ atoms/cm$^3$ and not more than $5.9 \times 10^{17}$ atoms/cm$^3$ and a nitrogen concentration of not more than $1.0 \times 10^{12}$ atoms/cm$^3$; executing a three separate rapid thermal annealing (RTA) treatments of the wafer at temperatures within different temperature ranges over different time periods in a different atmospheres of argon with and without ammonia.

5 Claims, 6 Drawing Sheets

(51) Int. Cl.
   *C30B 29/06*       (2006.01)
   *H10P 36/20*      (2026.01)

(56)          References Cited

U.S. PATENT DOCUMENTS

| | | | |
|---|---|---|---|
| 8,916,953 B2 * | 12/2014 | Qu | C30B 33/02 |
| | | | 257/617 |
| 9,834,861 B2 * | 12/2017 | Xiao | C30B 29/06 |
| 2001/0055689 A1 | 12/2001 | Park | |
| 2003/0029859 A1 | 2/2003 | Knoot et al. | |
| 2004/0194692 A1 * | 10/2004 | Nishikawa | C30B 33/00 |
| | | | 257/E21.321 |
| 2009/0242843 A1 * | 10/2009 | Ebara | H10P 36/20 |
| | | | 423/349 |
| 2010/0288184 A1 | 11/2010 | Ono et al. | |
| 2012/0001301 A1 | 1/2012 | Ebara et al. | |
| 2018/0016702 A1 * | 1/2018 | Xiao | C30B 31/22 |
| 2020/0024833 A1 * | 1/2020 | Azzouni | E21B 41/0057 |
| 2020/0240039 A1 * | 7/2020 | Mueller | C30B 29/06 |

FOREIGN PATENT DOCUMENTS

| | | | | |
|---|---|---|---|---|
| EP | 1284311 | A2 | 2/2003 | |
| EP | 3428325 | A1 | 1/2019 | |
| JP | 4284886 | B2 * | 6/2009 | |
| JP | 4720058 | B2 * | 7/2011 | H10P 36/20 |
| JP | 2014034513 | A | 2/2014 | |
| JP | 2016124756 | A | 7/2016 | |
| WO | WO 2009028658 | A1 | 3/2009 | |

* cited by examiner

PROCESS FOR MANUFACTURING A MONOCRYSTALLINE SILICON SEMICONDUCTOR WAFER, AND MONOCRYSTALLINE SILICON SEMICONDUCTOR WAFER

CROSS REFERENCE TO RELATED APPLICATIONS

This application is a U.S. National Phase application under 35 U.S.C. § 371 of International Application No. PCT/EP2022/074567, filed on Sep. 5, 2022, and claims benefit to European Patent Application No. EP21197148, filed on Sep. 16, 2021. The International Application was published in German on Mar. 23, 2023 as WO 2023/041359 A1 under PCT Article 21(2).

FIELD

The present disclosure is directed to producing a semiconductor wafer of monocrystalline silicon and also a semiconductor wafer made of monocrystalline silicon.

BACKGROUND

The fabrication of certain electronic components, such as those of the BCD type (BIPOLAR-CMOS-DMOS), requires as its base material semiconductor wafers made of monocrystalline silicon that are distinguished by a particular mechanical robustness, especially during machining steps which must be carried out over a prolonged period at comparatively high temperatures. Such wafers, furthermore, are typically required to exhibit expected properties, such as a denuded zone (DZ) with an envisaged depth and, in the interior of the semiconductor wafer, a region bordering the DZ and featuring seeds which can be developed into BMDs (bulk micro-defects) with a high peak density. A denuded zone is understood to be a region of the crystal lattice of the semiconductor wafer that is free of BMDs and in which no BMDs can be produced by means of the heat treatment.

An RTA treatment under argon with a hold temperature of more than 1300° C. produces a comparatively flat DZ with a depth of a few µm, since oxygen under such conditions diffuses out in the vicinity of the surface. US 2012 0 001 301 A1 describes such an RTA treatment and the loss of oxygen entailing a weakening of the mechanical robustness of the semiconductor wafer. In order to strengthen the mechanical robustness of the semiconductor wafer and to promote formation of BMDs in the interior, the semiconductor wafer may be doped, with nitrogen, for example. For the production of the semiconductor wafer, it is ensured, when pulling the single crystal by the Czochralski method (CZ method), that the ratio of pulling velocity V and axial temperature gradient G at the phase boundary between the single crystal and the melt is regulated (V/G control) such that the crystal lattice exhibits certain properties in relation to point defects such as interstitial silicon atoms (silicon interstitials) and vacancies.

The term "rapid thermal annealing" (RTA) describes a heat treatment in which a semiconductor wafer is brought comparatively rapidly to a comparatively high temperature, held at this temperature for a comparatively short time, and then cooled comparatively rapidly. An apparatus suitable for implementing an RTA treatment is described for example in US 2003 0 029 859 A1. During the RTA treatment the semiconductor wafer in the apparatus lies on a ring, and is rotated and exposed to thermal radiation from above.

It is also known that an RTA treatment under an atmosphere of argon and ammonia followed by an RTA treatment under argon leaves a comparatively deep DZ (T. Müller et al., "Near-Surface Defect Control by Vacancy Injecting/Out-Diffusing Rapid thermal Annealing", Phys. Status Solidi A, 2019, 1900325).

A disadvantage of nitrogen doping of the semiconductor wafer during the pulling of the single crystal is that a comparatively high nitrogen concentration in the interior of the semiconductor wafer promotes the formation of OSF defects (oxygen-induced stacking faults).

SUMMARY

In an embodiment, the present disclosure provides a method that produces a semiconductor wafer of monocrystalline silicon. The method includes, in the following order: growing a single crystal of silicon by the Czochralski (CZ) method; dividing at least one semiconductor wafer of monocrystalline silicon from the single crystal, the semiconductor wafer consisting completely of an N region, in which there are no agglomerates of silicon interstitials or vacancies having a diameter of more than 20 nm, and has an oxygen concentration of not less than $5.3 \times 1017$ atoms/cm3 and not more than $5.9 \times 1017$ atoms/cm3 and a nitrogen concentration of not more than $1.0 \times 1012$ atoms/cm3; executing a first rapid thermal annealing (RTA) treatment of the semiconductor wafer at a first temperature in a first temperature range of not less than 750° C. and not more than 1100° C. over a first period of not less than 10 s and not more than 30 s in a first atmosphere of argon and ammonia in a ratio of not less than 1:2 and not more than 1:0.75; executing a second RTA treatment of the semiconductor wafer at a second temperature in a second temperature range of not less than 1190° C. and not more than 1280° C. over a second period of not less than 20 s and not more than 35 s in a second atmosphere of argon; and executing a third RTA treatment of the semiconductor wafer at a third temperature in a third temperature range of not less than 1160° C. and not more than 1180° C. over a third period of not less than 15 s and not more than 25 s in a third atmosphere of argon and ammonia in a ratio of not less than 8:10 and not more than 3:2.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
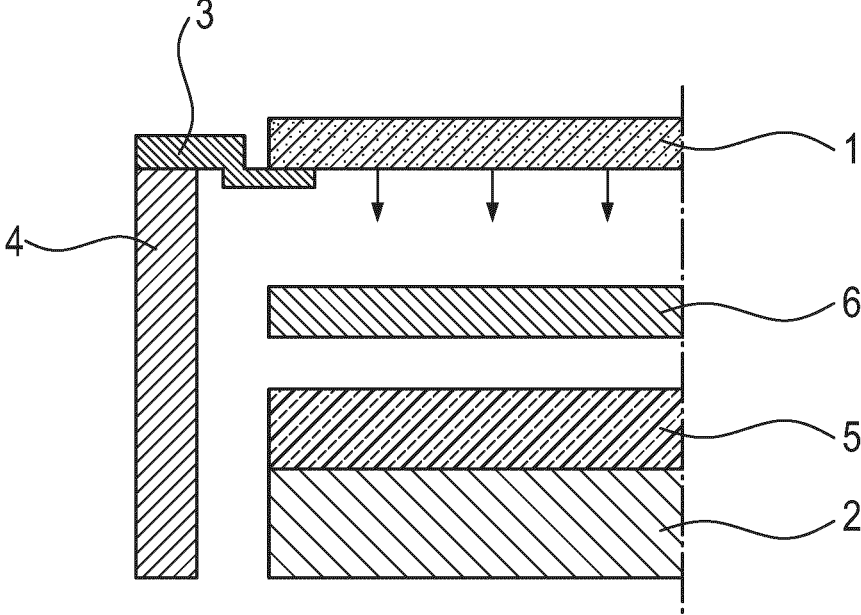
FIG. 1 shows a partial view of the arrangement of a semiconductor wafer during an RTA treatment in an apparatus configured for that purpose.

Aspects of the present disclosure provide access to a semiconductor wafer of monocrystalline silicon that meets the mechanical robustness requirements without being hampered by OSF defects. The semiconductor wafer, furthermore, has the capacity to develop BMDs beneath a DZ, with a radially uniform BMD density. The semiconductor wafer also possesses these properties independently of its position in the single crystal.

An aspect of the present disclosure provides a method for producing a semiconductor wafer of monocrystalline silicon, comprising in this order:

the growing of a single crystal of silicon by the CZ method;

the dividing of at least one semiconductor wafer of monocrystalline silicon from the single crystal, where the semiconductor wafer consists completely of N region, in which there are no agglomerates of silicon interstitials or vacancies having a diameter of more than 20 nm, and has an oxygen concentration of not less than $5.3 \times 10^{17}$ atoms/cm$^3$ and not more than $5.9 \times 10^{17}$ atoms/cm$^3$ and a nitrogen concentration of not more than $1.0 \times 10^{12}$ atoms/cm$^3$;

a first RTA treatment of the semiconductor wafer at a temperature in a first temperature range of not less than 750° C. and not more than 1100° C. over a period of not less than 10 s and not more than 30 s in a first atmosphere of argon and ammonia in a ratio of not less than 1:2 and not more than 1:0.75;

a second RTA treatment of the semiconductor wafer at a temperature in a second temperature range of not less than 1190° C. and not more than 1280° C. over a period of not less than 20 s and not more than 35 s in a second atmosphere of argon; and a third RTA treatment of the semiconductor wafer at a temperature in a third temperature range of not less than 1160° C. and not more than 1180° C. over a period of not less than 15 s and not more than 25 s in a third atmosphere of argon and ammonia in a ratio of not less than 8:10 and not more than 3:2.

An RTA treatment in the sense of the present disclosure comprises the rapid heating of the semiconductor wafer of monocrystalline silicon to a target temperature, the holding of the semiconductor wafer at the target temperature for a hold time, and the rapid cooling of the semiconductor wafer from the target temperature. The rate of the temperature increase during the heating is preferably not less than 15° C./s, more preferably not less than 25° C./s, and the rate of the temperature drop during the cooling is not less than 25° C./s. The rate of the temperature increase and the rate of the temperature drop are preferably lower in the case of temperatures with a difference of up to 100° C. from the target temperature than in the case of temperatures with a greater difference. The semiconductor wafer may be cooled or heated, respectively, from one target temperature to the next, or may, between two target temperatures, undergo intermediate cooling to a base temperature of not more than 650° C.

In the first RTA treatment, the semiconductor wafer is heated from a base temperature to a target temperature in a first temperature range of not less than 750° C. and not more than 1100° C. and held over a period of not less than 10 s and not more than 30 s at the target temperature in a first atmosphere of argon (Ar) and ammonia (NH$_3$) in a ratio of not less than 1:2 and not more than 1:0.75. The first and the third RTA treatments represent steps of nitriding the front side of the semiconductor wafer and to a lesser extent the back side of the semiconductor wafer. The nitrogen concentration which by virtue of a nitriding RTA treatment passes into the near-surface region of the semiconductor wafer is in fact approximately 50% lower on the back side than on the front side. As a result, increasing the robustness of the semiconductor wafer is focused on the near-surface region of the front side of the semiconductor wafer.

In combination with the second and optionally with a fourth RTA treatment, nitrogen is diffused into the near-surface region of the semiconductor wafer. In this way up to $2 \times 10^{15}$ atoms/cm$^3$ of nitrogen pass into the near-surface region of the semiconductor wafer and ensure sufficient robustness of the crystal lattice. Nitrogen-induced formation of OSF defects in the interior of the semiconductor wafer does not take place, since the nitrogen concentration necessary for such formation is not attained there.

The second RTA treatment of the semiconductor wafer is carried out at a temperature in a second temperature range of not less than 1190° C. and not more than 1280° C. over a period of not less than 20 s and not more than 35 s in a second atmosphere of argon.

The third RTA treatment of the semiconductor wafer is carried out at a temperature in a third temperature range of not less than 1160° C. and not more than 1180° C. over a period of not less than 15 s and not more than 25 s in a third atmosphere of argon and ammonia in a ratio of not less than 8:10 and not more than 3:2.

According to one preferred embodiment of the present disclosure, furthermore, a fourth RTA treatment of the semiconductor wafer is also carried out, at a temperature in a fourth temperature range of not less than 1130° C. and not more than 1145° C. over a period of not less than 25 s and not more than 35 s in a fourth atmosphere of argon.

According to an aspect of the present disclosure, the semiconductor wafer may be cut from a single crystal which has been pulled by the CZ method under V/G control in such a way that the crystal lattice of the semiconductor wafer consists exclusively of N region, in which there are no agglomerates of silicon interstitials or vacancies having a diameter of more than 20 nm. The N region preferably comprises at least one Ni domain, in which silicon interstitials are predominant as the type of point defect, and at least one Nv domain, in which vacancies are predominant as the type of point defect. The single crystal is not intentionally doped with nitrogen. The nitrogen concentration is therefore not more than $1.0 \times 10^{12}$ atoms/cm$^3$. The semiconductor wafer divided from the single crystal has an oxygen concentration of not less than $5.3 \times 10^{17}$ atoms/cm$^3$ and not more than $5.9 \times 10^{17}$ atoms/cm$^3$ (new ASTM). The oxygen concentration in the single crystal can be adjusted during production of said crystal, as for example via the regulation of the speed of rotation of the crucible and/or of the single crystal and/or by way of the regulation of the pressure and/or of the flow rate of the gas forming the atmosphere in which the single crystal grows, and/or by way of the regulation of the strength of the magnetic field which is imposed on the melt.

A magnetic field is preferably imposed on the melt during the pulling of the single crystal, more preferably a horizontal magnetic field or a CUSP magnetic field.

The pulling velocity V is preferably not less than 0.5 mm/min, where the intention is to produce semiconductor wafers having a diameter of at least 300 mm.

The single crystal grows preferably in an atmosphere of argon or, more preferably, in an atmosphere containing argon and hydrogen. The partial pressure of hydrogen is preferably less than 40 Pa.

The further processing of the semiconductor wafer after its division from the single crystal and before the RTA treatments preferably comprises the mechanical working of the semiconductor wafer divided from the single crystal, by lapping and/or grinding, the removal of damaged crystal regions near to the surface, by etching, and preliminary cleaning of the semiconductor wafer in SC1 solution, SC2 solution, and ozone.

An aspect of the present disclosure provides a semiconductor wafer of monocrystalline silicon having a front side and a back side, consisting of N region, comprising:

an interstitial oxygen concentration of not less than $5.3 \times 10^{17}$ atoms/cm$^3$ and not more than $5.9 \times 10^{17}$ atoms/cm$^3$;

a nitrogen concentration which decreases from the front side and from the back side into the interior of the semiconductor wafer and in a depth of 50 μm from the front side is not less than $2.0 \times 10^{15}$ atoms/cm$^3$.

The semiconductor wafer is preferably distinguished by the following further properties:

The concentration of nitrogen, considered in a near-surface region from the back side up to 150 μm into the interior of the semiconductor wafer, is lower than considered in a near-surface region from the front side up to 150 μm into the interior of the semiconductor wafer. Up to a depth of 150 μm, the concentration of nitrogen in the near-surface region of the front side is $1.0 \times 10^{14}$ atoms/cm$^3$ to $2.0 \times 10^{15}$ atoms/cm$^3$, measured with LT-FTIR. In the interior in between the concentration drops to a local minimum, which corresponds to the nitrogen concentration in the single crystal from which the semiconductor wafer originates. The front side is the side of the semiconductor wafer which lies upward during the RTA treatment. The concentration of nitrogen in the near-surface region of the back side of the semiconductor wafer is approximately 50% of the concentration of nitrogen in the near-surface region of the front side of the semiconductor wafer.

The density of agglomerates of vacancies in the semiconductor wafer with a size of less than 20 nm is preferably less than $5.0 \times 10^{15}$ cm$^{-3}$, measured with IR-LST and a laser power of at least 70 mW.

After a test by means of a heat treatment of the semiconductor wafer whereby seeds are developed into BMDs, the semiconductor wafer has a denuded zone which extends from the front side to a depth of preferably not less than 10 μm and not more than 20 μm into the interior of the semiconductor wafer. The density of BMDs is preferably $4.0 \times 10^9$ cm$^{-3}$ to $8.0 \times 10^9$ cm$^{-3}$, more preferably $5.0 \times 10^9$ cm$^{-3}$ to $7.0 \times 10^9$ cm$^{-3}$. This heat treatment comprises the heating of the semiconductor wafer of monocrystalline silicon to a temperature of 800° C. over a time of four hours and subsequently the heating of the semiconductor wafer to a temperature of 1000° C. over a time of 16 hours in an atmosphere which consists of ten volume fractions of nitrogen and one volume fraction of oxygen. In a radial direction from the center to the edge of the semiconductor wafer the density of BMDs varies preferably by less than 15%. The variation is determined by ascertaining the BMD density from the center to the edge at 148 positions and relating the greatest (max) to the smallest (min) ascertained BMD density in the formula (max-min)×100%/average. The average is the arithmetic mean of the BMD densities ascertained at the positions.

The capacity of the semiconductor wafer to be able to develop BMDs is present independently of the axial position possessed by the material of the semiconductor wafer in the single crystal before the semiconductor wafer was separated from it. Because the single crystal is not intentionally doped with nitrogen, there are no effects brought about by nitrogen segregation and causing this capacity to be dependent on the axial position.

After a test by means of a heat treatment of the semiconductor wafer at a temperature of 1000° C. over a time of four hours in dry oxygen, the density of OSF defects is preferably less than 1/cm$^2$.

In an atmosphere of argon and hydrogen (partial pressure of hydrogen: 25-35 Pa) a single crystal of silicon was pulled according to the CZ method and processed further into semiconductor wafers with polished front and back sides. Owing to the conditions in terms of the V/G ratio selected in the course of pulling, the crystal lattice of the semiconductor wafers, with a diameter of 300 mm, consisted exclusively of N region, with a fraction of Nv domain and a fraction of Ni domain. According to the new ASTM, the semiconductor wafers, which were subjected subsequently to a series of RTA treatments, had an oxygen concentration of $5.8 \times 10^{17}$ atoms/cm$^3$.

The semiconductor wafers were assigned to four groups and subjected to RTA treatments under conditions which are summarized in the table:

| | Atmosphere | Temperature | Time | Group |
|---|---|---|---|---|
| first RTA treatment | Ar/NH$_3$ 10:13.5 | 1050° C. | 20 s | A, B, C, D |
| second RTA treatment | Ar | 1270° C. 1230° C. | 30 s | A, B, D C |
| third RTA treatment | Ar/NH$_3$ 5:10 | 1170° C. 1175° C. | 20 s | A, C, D B |
| fourth RTA treatment | Ar | 1140° C. | 30 s | C, D |

The semiconductor wafers were heated at a rate of 70° C./s to the target temperature of the first RTA treatment and cooled at a rate of 30° C./s from the target temperature of the last RTA treatment.

FIG. 1 shows a partial view of the arrangement of the respective semiconductor wafer 1 during an RTA treatment in an apparatus configured for this purpose, having a base 2. The semiconductor wafer 1 lies on a ring 3 and is heated from above, with only the front side of the semiconductor wafer 1 exposed directly to the atmosphere dictated by the RTA treatment. The ring 3 lies on a cylinder 4, which is rotated. Between the semiconductor wafer 1 and a reflector plate 5 there is a cover 6 made of quartz. The presence of the cover 6, and the fact that gas of the atmosphere is unable to pass unhindered to the back side of the semiconductor wafer, are critically responsible for ensuring that the concentration of nitrogen which passes into the semiconductor wafer near the surface in a nitriding RTA treatment is higher in the region of the front side than in the region of the back side of the semiconductor wafer.

In order to determine the capacity for BMDs to develop in an inner region (BMD test), the semiconductor wafers were heat-treated in an atmosphere composed of a mixture of oxygen and nitrogen with an O$_2$:N$_2$ volume ratio of 1:10 first over a period of 4 hours at a temperature of 800° C. and subsequently over a period of 16 hours at a temperature of 1000° C.

For the purpose of determining the depth of the denuded zone, the radial density distribution and radial size distribution of BMDs, an LST 300A analytical tool from the manufacturer Semilab Co. Ltd., Hungary, was available. This tool was used to analyze the semiconductor wafers by means of IR-LST (infrared light scattering tomography).

Figure 2:
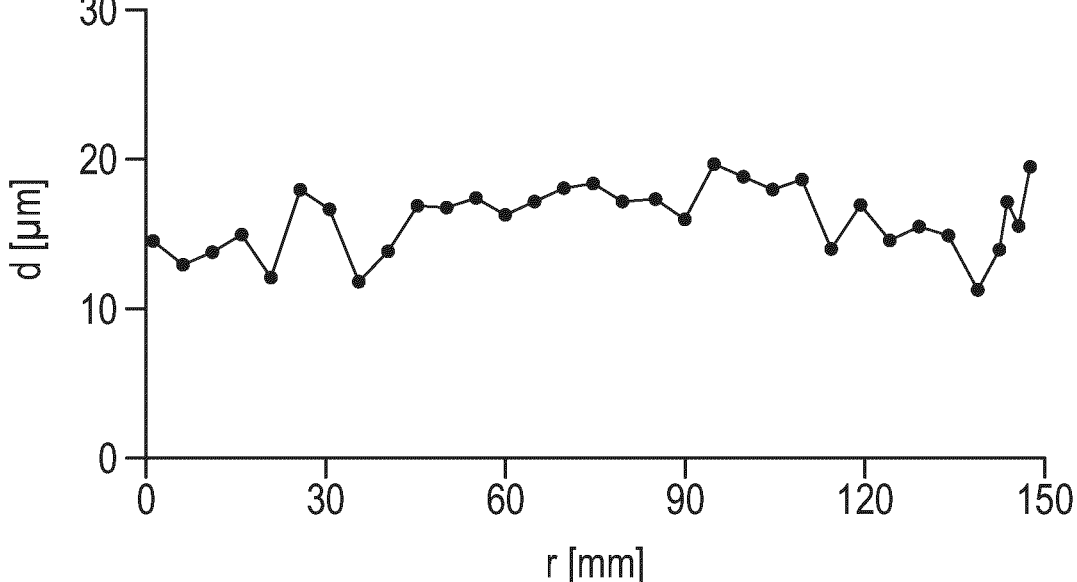
FIG. 2 shows the profile of the depth of the denuded zone as a function of the radius r of a semiconductor wafer produced according to the present disclosure.

FIG. 2, on a representative example, shows the profile of the depth d of the denuded zone as a function of the radius r of a semiconductor wafer of the invention. The average depth of the denuded zone is about 14 μm.

Figure 3:
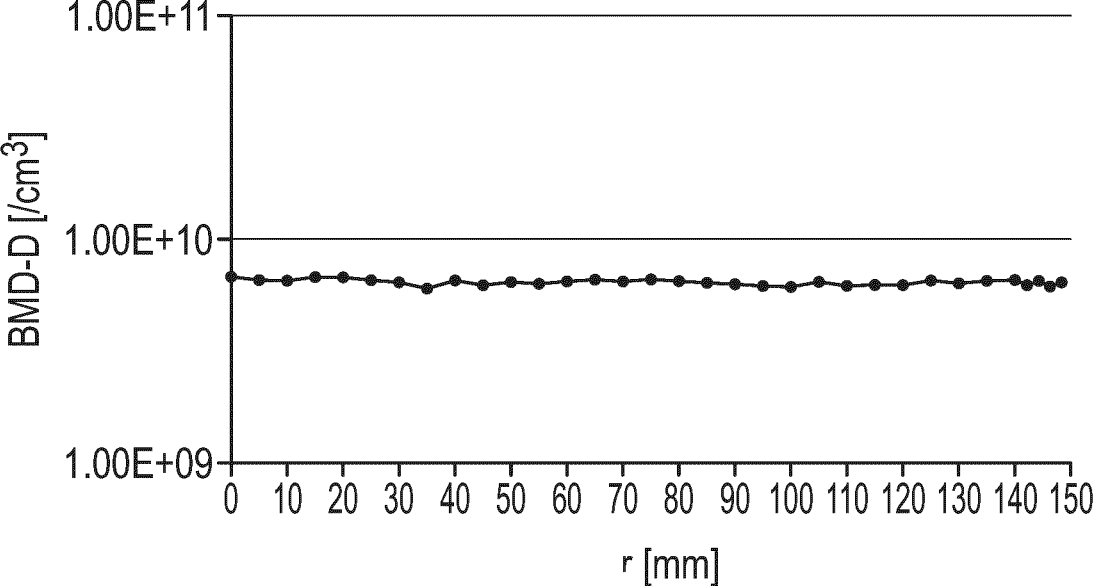
FIG. 3 shows the profile of the density of BMDs as a function of the radius r of a semiconductor wafer produced according to the present disclosure.

FIG. 3, on a representative example, shows the profile of the density of BMDs (BMD-D) as a function of the radius r of a semiconductor wafer of the invention. The average density of BMDs is about $6.5×10^9/cm^3$. The radial fluctuation in BMD densities here is 11.6%

The semiconductor wafers were subjected to thermal stress in a deposition reactor for depositing an epitaxial layer, in order to test their robustness. In a deposition reactor of this kind, the semiconductor wafer is located between upper and lower lamp arrays, which direct thermal radiation onto the back side and the front side of the semiconductor wafer. The test was designed so that the semiconductor wafer was heated to a greater extent, by 5° C., in an edge region than in the central region surrounded by the edge region. The semiconductor wafers were subsequently analyzed by means of SIRD (Scanning Infra-Red Depolarization). Infrared radiation passed through the semiconductor wafer is depolarized in regions of the crystal lattice which have suffered damage due to thermal stresses. The greater the damage, the higher the depolarization, measured in depolarization units (DU).

Figure 4:
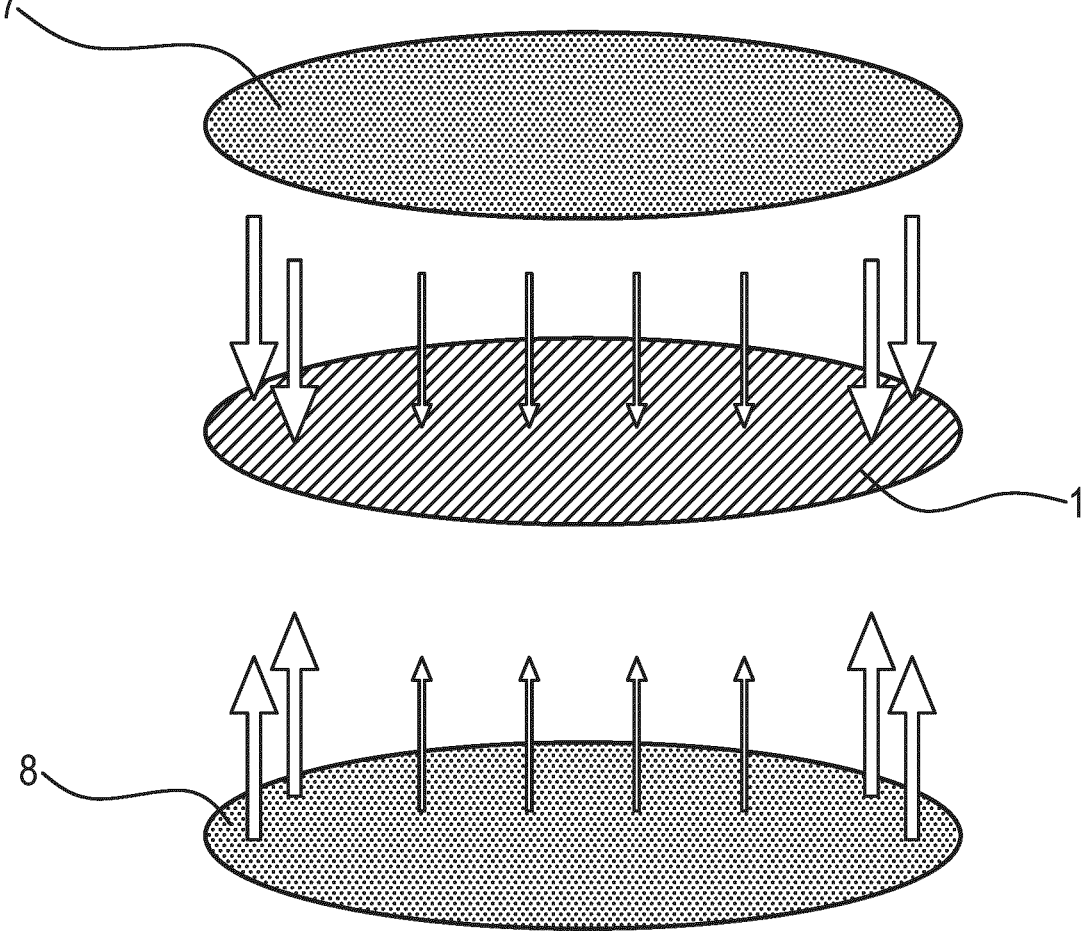
FIG. 4 shows the arrangement of a semiconductor wafer during the generation of thermal stress.

FIG. 4 shows the arrangement of the semiconductor wafer 1 during the generation of thermal stress between upper lamp arrays 7 and lower lamp arrays 8 in a deposition reactor, where bold arrows symbolize the higher temperature in the edge region of the semiconductor wafer, generated there by means of the irradiation.

Figure 5:
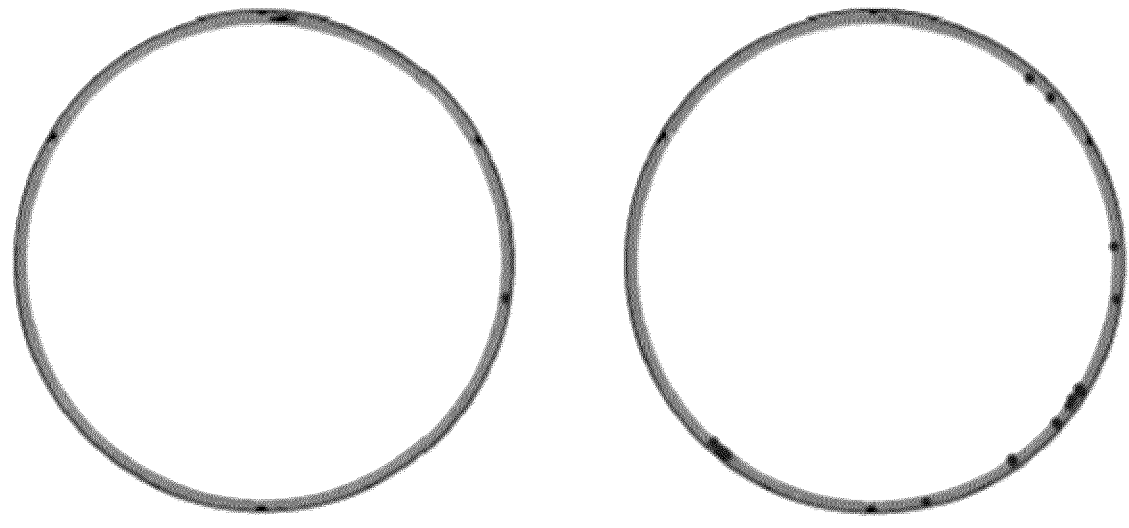
FIG. 5 shows maps of SIRD stresses in a ring-shaped edge region of semiconductor wafers.

FIG. 5 shows maps of SIRD stresses in a ring-shaped edge region (from the edge up to 5 mm radially inward) for an example (left-hand figure) and a comparative example (right-hand figure). The semiconductor wafer of the example belonged to group C; the semiconductor wafer of the comparative example differed from it in having not been subjected to any RTA treatments.

On the semiconductor wafer of the example, a threshold for the amount of depolarization of 40 DU was exceeded in 0.1% of the area analyzed; in the case of the semiconductor wafer of the comparative example, the fraction was 1.2%.

Figure 6:
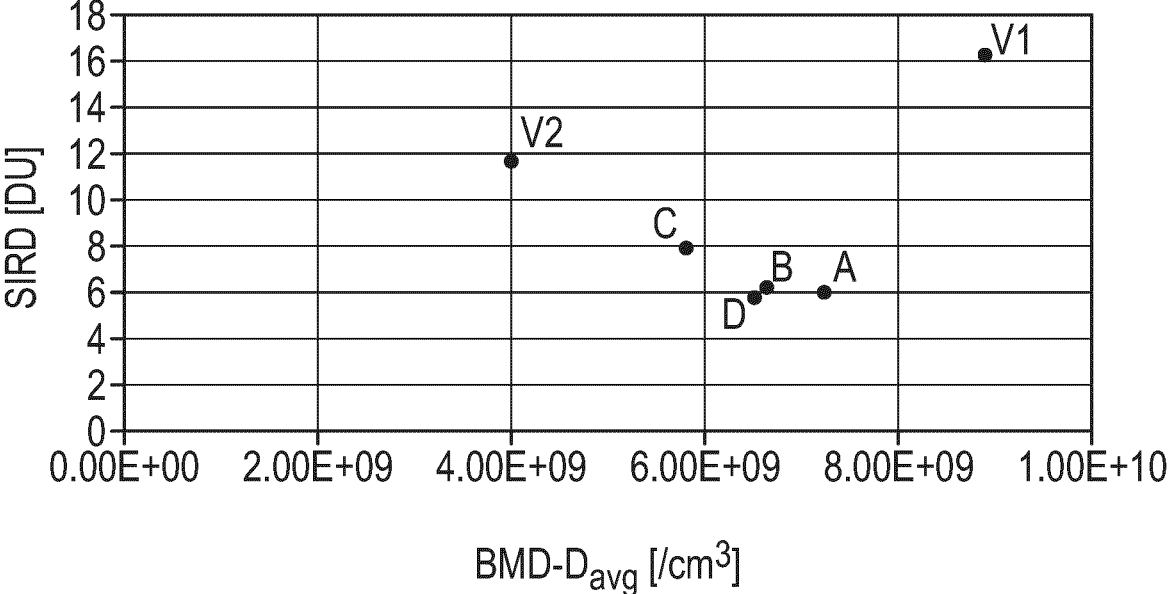
FIG. 6 is a diagram showing the relationship between depolarization and density of BMDs.

FIG. 6 is a diagram showing the relationship between depolarization and density of BMDs. It depicts the mean depolarization SIRD, determined at measurement points distributed over the entire area of the respective semiconductor wafer, as a function of the mean BMD density $BMD-D_{avg}$.

Accordingly the stress load in semiconductor wafers of groups A to D is comparatively small. For the comparative examples of semiconductor wafers with BMD densities of less than $4.0×10^9$ $cm^{-3}$ or more than $8.0×10^9$ $cm^{-3}$, the stress load is significantly greater. For the comparative examples, the semiconductor wafers are wafers not subjected to any RTA treatment (comparative example V1) or wafers for which the RTA treatments were carried out in part differently from the invention (comparative example V2). Hence a first RTA treatment was performed at a temperature of 1175° C. over a period of 5 s in an atmosphere of argon, followed by a second RTA treatment at a temperature of 1170° C. over a period of 15 s in an atmosphere of argon and ammonia in a ratio of 10:7.5, and a third RTA treatment at a temperature of 1150° C. over a period of 30 s in an atmosphere of argon.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS USED

1 semiconductor wafer
2 base
3 ring
4 cylinder
5 reflector plate
6 cover
7 upper lamp arrays
8 lower lamp arrays

What is claimed is:

1. A method for producing a semiconductor wafer of monocrystalline silicon, the method comprising in the following order:

growing a single crystal of silicon by the Czochralski (CZ) method;

dividing at least one semiconductor wafer of monocrystalline silicon from the single crystal, wherein the semiconductor wafer consists completely of an N region, in which there are no agglomerates of silicon interstitials or vacancies having a diameter of more than 20 nm, and has an oxygen concentration of not less than $5.3×10^{17}$ atoms/cm$^3$ and not more than $5.9×10^{17}$ atoms/cm$^3$ and a nitrogen concentration of not more than $1.0×10^{12}$ atoms/cm$^3$;

executing a first rapid thermal annealing (RTA) treatment of the semiconductor wafer at a first temperature in a first temperature range of not less than 750° C. and not more than 1100° C. over a first period of not less than 10 s and not more than 30 s in a first atmosphere of argon and ammonia in a ratio of not less than 1:2 and not more than 1:0.75;

executing a second RTA treatment of the semiconductor wafer at a second temperature in a second temperature range of not less than 1190° C. and not more than 1280° C. over a second period of not less than 20 s and not more than 35 s in a second atmosphere of argon; and executing a third RTA treatment of the semiconductor wafer at a third temperature in a third temperature range of not less than 1160° C. and not more than 1180° C. over a third period of not less than 15 s and not more than 25 s in a third atmosphere of argon and ammonia in a ratio of not less than 8:10 and not more than 3:2.

2. The method as claimed in claim 1, which further comprises a fourth RTA treatment of the semiconductor wafer at a fourth temperature in a fourth temperature range of not less than 1130° C. and not more than 1145° C. over a fourth period of not less than 25 s and not more than 35 s in a fourth atmosphere of argon.

3. A semiconductor wafer of monocrystalline silicon having a front side and a back side, consisting of an N region, comprising an interstitial oxygen concentration of not less than $5.3 \times 10^{17}$ atoms/cm$^3$ and not more than $5.9 \times 10^{17}$ atoms/cm$^3$; and a nitrogen concentration, which decreases from the front side and from the back side into the interior of the semiconductor wafer and in a depth of 50 μm from the front side is not less than $2.0 \times 10^{15}$ atoms/cm$^3$.

4. The semiconductor wafer as claimed in claim 3, wherein the nitrogen concentration in a near-surface region of the back side is lower than in a near-surface region of the front side.

5. The semiconductor wafer as claimed in claim 3, which comprises:

a denuded zone, which extends from the front side to a depth of not less than 10 μm and not more than 20 μm into the interior of the semiconductor wafer, and an underlying region with BMDs of a density of $5.0 \times 10^9$ cm$^{-3}$ to $7.0 \times 10^9$ cm$^{-3}$.

\* \* \* \* \*